United States Patent
Chen et al.

(10) Patent No.: US 9,287,126 B2
(45) Date of Patent: Mar. 15, 2016

(54) MULTI-WAFER PAIR ANODIC BONDING APPARATUS AND METHOD

(71) Applicant: Hewlett-Packard Development Company, L.P., Houston, TX (US)

(72) Inventors: Chien-Hua Chen, Corvallis, OR (US); Kianush Naeli, Corvallis, OR (US); Stephen R. Farrar, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 75 days.

(21) Appl. No.: 13/872,632

(22) Filed: Apr. 29, 2013

(65) Prior Publication Data
US 2014/0322892 A1    Oct. 30, 2014

(51) Int. Cl.
*H01L 21/20* (2006.01)
*H01L 23/00* (2006.01)
*C03C 27/00* (2006.01)

(52) U.S. Cl.
CPC ............ *H01L 21/2007* (2013.01); *C03C 27/00* (2013.01); *H01L 24/74* (2013.01); *H01L 24/80* (2013.01); *H01L 2224/05638* (2013.01); *H01L 2224/05687* (2013.01); *H01L 2224/08145* (2013.01); *H01L 2224/08225* (2013.01); *H01L 2224/74* (2013.01); *H01L 2224/759* (2013.01); *H01L 2224/7525* (2013.01); *H01L 2224/75102* (2013.01); *H01L 2224/75901* (2013.01); *H01L 2224/80048* (2013.01); *H01L 2224/80487* (2013.01); *H01L 2224/80488* (2013.01); *H01L 2224/80893* (2013.01); *H01L 2924/1461* (2013.01)

(58) Field of Classification Search
CPC ............ H01L 21/2007; H01L 21/2011; H01L 21/76251; C03C 27/00–27/10
See application file for complete search history.

(56) References Cited

U.S. PATENT DOCUMENTS

| | | | |
|---|---|---|---|
| 6,610,582 B1 * | 8/2003 | Stewart | 438/455 |
| 7,651,197 B2 * | 1/2010 | Umeda et al. | 438/455 |
| 2002/0069960 A1 * | 6/2002 | Gross | 156/274.8 |

* cited by examiner

*Primary Examiner* — Stephen W Smoot
*Assistant Examiner* — Sun M Kim
(74) *Attorney, Agent, or Firm* — Rathe Lindenbaum LLP

(57) ABSTRACT

An electric field concurrently anodically bonds together wafers of each of a plurality of independent wafer pairs.

11 Claims, 6 Drawing Sheets

MULTI-WAFER PAIR ANODIC BONDING APPARATUS AND METHOD

BACKGROUND

Anodic bonding, also known as field assisted bonding or electrostatic sealing, is sometimes used to bond wafers. Existing anodic wafer bonders and anodic wafer bonding processes have long cycle times, driving up cost and lowering throughput capacity.

DETAILED DESCRIPTION OF THE EXAMPLE EMBODIMENTS

Figure 1:
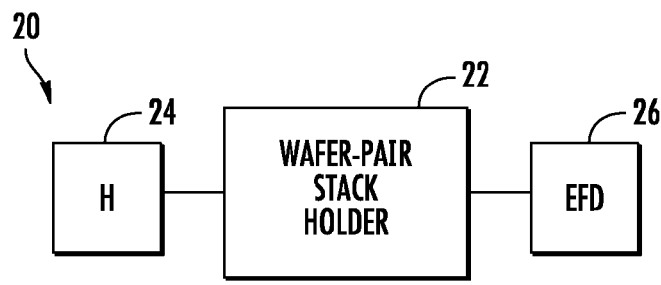
FIG. 1 is a schematic illustration of an example wafer bonder.

FIG. 1 schematically illustrates an example wafer bonder 20. As will be described hereafter, wafer bonder 20 concurrently anodically bonds multiple independent wafer pairs to reduce cycle time, to increase bonding capacity and lower costs. Wafer bonder 20 comprises wafer pair stack holder 22, heater 24 and electric field device 26.

Wafer pair stack holder 22 comprises one or more devices to hold or retain a stack of independent wafer pairs. The term "independent" means that the wafer pairs are not joined or bonded to one another by wafer bonder 20. In one implementation, holder 22 retains wafer pairs in a back-to-back arrangement. A "back-to-back arrangement" means that similar faces of similar wafer pairs face away from one another. Wafers of wafer pairs that are similar to one another are held or retained adjacent to one another in the stack. For example, with wafer pairs formed of a silicon based wafer and a glass wafer, the silicon based wafer are positioned adjacent to one another in the stack or the glass wafers are positioned adjacent one another in the stack.

Once wafers of a wafer pair are bonded to one another by bonder 20, the bonded wafer pair may be severed or cut into multiple individual dies. Such dies may comprise micro electromechanical devices (MEMs) or other electronic components. In one implementation, a wafer pair comprises a silicon based wafer and an alkaline glass wafer, such as borosilicate glass wafer, that may cover, seal or protect electronics provided on the silicon based wafer. Examples of silicon based wafers comprise silicon wafers, silicon on insulator wafers (SOI) (silicon with a buried insulator oxide (box) such as $SIO_2$) and silicon upon a face of which an oxide has been coated or grown. The oxide buried in the silicone or formed upon a surface of the silicone may be the result of prior fabrication processes (etching and the like wherein the oxide layer has not been removed) and/or may serve to reduce parasitic device capacitance.

In one implementation, holder 22 is further configured to apply force or pressure on the wafer stack, compressing the various wafers against one another. In other implementations, such compression is omitted. In one implementation, holder 22 comprises a pair of opposing chucks. In one implementation, holder 22 is utilized by electric field device 26 in applying electric fields to the stack of wafers held by holder 22.

Heater 24 comprises a device to heat the stack of wafer pairs held by holder 22. Heater 24 applies sufficient heat to the stack wafer pairs to facilitate anodic bonding. In one implementation in which each of the wafer pairs comprises a silicon based wafer and an alkaline glass, heater 24 heats the stack of wafer pairs to a temperature of at least 250° C. and nominally 375° C. In one implementation, heater 24 applies heat to the stack of wafer pairs held by holder 22 while the stack of wafer pairs are housed or contained in a vacuum chamber.

Electric field device 26 comprises a device electrically coupled or connected to the stack of wafer pairs held by holder 22 so as to concurrently anodically bond each of the individual wafer pairs in the stack. Electric field device 26 comprises a device electrically coupled to the stack of wafer pairs held by holder 22 so as to create or form a first electric field in a first direction across the first junction of a first wafer pair and a second electric field in a second direction opposite the first direction across a second junction of a second wafer pair to anodically bond the first wafer pair at the first junction and the second wafer pair at the second junction.

Figure 2:
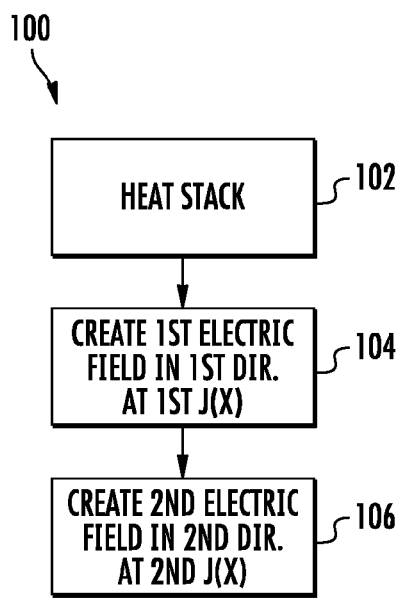
FIG. 2 is a flow diagram of an example anodic bonding method that may be carried out by the wafer bonder of FIG. 1.

FIG. 2 is a flow diagram of an example anodic bonding method 100 that may be carried out by bonder 20. As indicated by step 102, heater 24 heats the stack of independent wafer pairs held by holder 22. Heater 24 applies sufficient heat to the stack wafer pairs to facilitate anodic bonding. In one implementation in which each of the wafer pairs comprises a silicon based wafer and an alkaline glass, heater 24 heats the stack of wafer pairs to a temperature of at least 250° C. and nominally or and 75° C.

As indicated by step 104, electric field device 26 creates a first electric field in a first direction at or across a first junction of a first wafer pair. As indicated by step 106, electric field device 26 concurrently creates a second electric field in a second direction at or across a second junction of a second wafer pair. As a result, the wafers along the first and second junctions are anodically bonded to one another.

Figure 3:
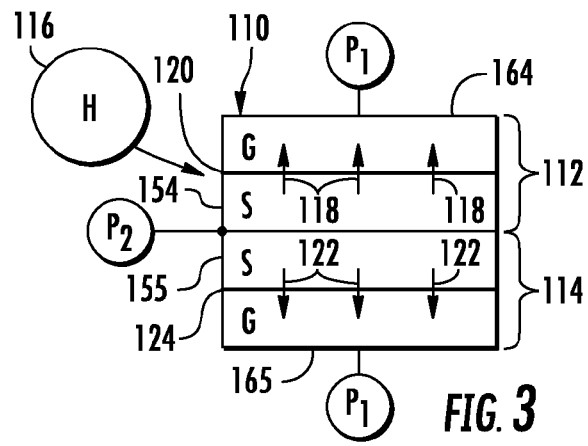
FIG. 3 is a schematic diagram illustrating one example of anodic bonding of a stack of independent wafer pairs by the bonder of FIG. 1 according to the method of FIG. 2.

FIG. 3 illustrates one example anodic bonding of a stack 110 of independent wafer pairs 112, 114. Wafer pairs 112, 114 comprise silicon based wafers 154, 155, and alkaline glass wafers 164, 165, respectively. Wafer pairs 112 and 114 are arranged in a back to back relationship.

As schematically shown by FIG. 3, heater 24 (shown in FIG. 1) applies heat 116 to heat stack 110 to an anodic bonding temperature. While stack 110 is at an elevated anodic bonding temperature (described above), electric field device 26 (shown in FIG. 1) creates oppositely directed electric fields through stack 110 by establishing a first electrical potential P1 at a top and a bottom of stack 210. Electric field device 26 further establishes a second electrical potential P2 between junctions 120 and 124 of wafer pairs 112 and 114. Although electrical potential P2 is illustrated as being applied or located equidistant from the adjacent junctions 120, 124, electrical potential P1 may be located anywhere between the associated adjacent junctions. For example, electrical potential P1 may be applied through an electrical contact that extends between wafers 155, 156, that contacts a side of either of wafers 155, 156 or that contacts a bottom face of wafer 155 or a top face of wafer 156.

The electrical potential P1 is different than the electrical potential P2 to create the oppositely directed electric fields through stack 110. The electrical potential P1 has a relationship to the electrical potential P2 such that $Na^+$ ions in the glass wafers 164, 165 are driven or kicked away from the adjacent wafer pair junctions 120, 124, respectively, to facilitate anodic bonding. In one implementation, electric potentials P1 are at ground while electrical potentials P2 are each at a positive voltage (+V). In another implementation, electrical potentials P2 are at ground while electrical potentials P1 are at a negative voltage (−V). In some implementations, electric potentials P1 may be different from one another.

As indicated by arrows 118, electric field device 26 (shown in FIG. 1) creates a first electric field in a first direction across junction 120 of wafer pair 112. As indicated by arrows 122, at the same time, electric field device 26 creates a second electric field in a second direction, opposite the first direction, across junction 124 of wafer pair 114. An anodic bond forms at each of junctures 120, 124 to concurrently complete bonding of wafer pairs 112 and 114.

Figure 4:
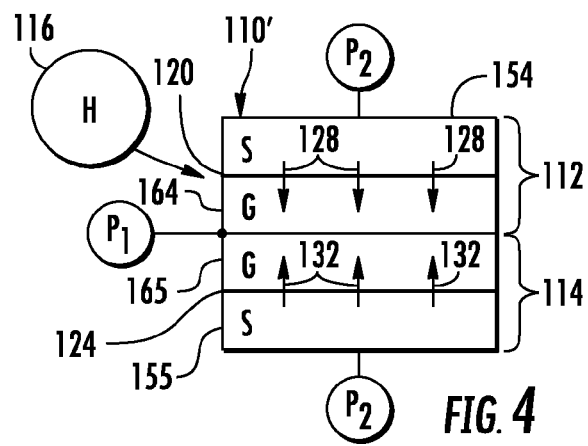
FIG. 4 is a schematic diagram illustrating another example of anodic bonding of a stack of independent wafer pairs by the bonder of FIG. 1 according to the method of FIG. 2.

FIG. 4 illustrates another example anodic bonding of a stack 110' of independent wafer pairs 112 and 114. Stack 110' is similar to stack 110 except that each of wafer pairs 112 and 114 are flipped such that the alkaline glass wafers 164 165 of wafer pairs 112, 114 extend back to back or adjacent to one another. Components of stack 110' which correspond to components of stack 110 are numbered similarly.

As schematically shown by FIG. 4, heater 24 applies heat 116 to heat stack 110' to an anodic bonding temperature. While stack 110' is at an elevated anodic bonding temperature (described above), electric field device 26 (shown in FIG. 1) creates oppositely directed electric fields through stack 110' by establishing a first electrical potential P2 at a top and a bottom of stack 110'. Electric field device 26 further establishes a second electrical potential P1 between junctions 120 and 124 of wafer pairs 112 and 114. Although electrical potential P1 is illustrated as being applied or located equidistant from the adjacent junctions, electrical potential P1 may be located anywhere between the associated adjacent junctions. For example, electrical potential P1 may be applied through an electrical contact that extends between wafers 164, 165, that contacts a side of either of wafers 164, 165 or that contacts a bottom face of wafer 164 or a top face of wafer 165.

The electrical potential P1 is different than the electrical potential P2 to create the oppositely directed electric fields through stack 110'. The electrical potential P1 has a relationship to the electrical potential P2 such that $Na^+$ ions in the glass wafers 164, 165 are driven or kicked away from the adjacent wafer pair junctions 120, 124, respectively, to facilitate anodic bonding. In one implementation, electric potentials P2 are at ground while electrical potentials P1 are each at a negative voltage (−V). In another implementation, electrical potential P1 is at ground while electrical potentials P1 are at a positive voltage (+V). In some implementations, electrical potentials P2 may be different from one another.

As indicated by arrows 128, electric field device 26 (shown in FIG. 1) creates a first electric field in a first direction across junction 120 of wafer pair 112. As indicated by arrows 132, at the same time, electric field device 26 creates a second electric field in a second direction, opposite the first direction, across junction 124 of wafer pair 114. An anodic bond forms at each of junctures 120, 124 to concurrently complete bonding of wafer pairs 112 and 114.

Figure 5:
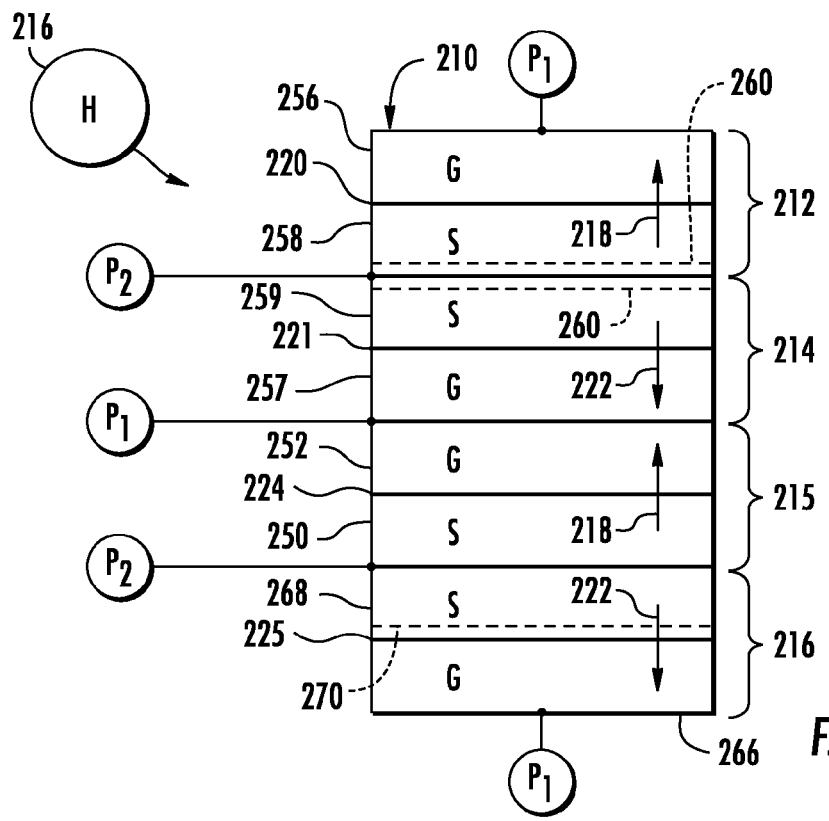
FIG. 5 is a schematic diagram illustrating another example of anodic bonding of a stack of independent wafer pairs by the bonder of FIG. 1 according to the method of FIG. 2.

As shown by FIG. 5, system 20 may concurrently anodically bond greater than two independent wafer pairs to reduce cycle time and lower cost. FIG. 5 illustrates an example of anodic bonding of a stack 210 of independent wafer pairs 212, 214, 215 and 216. Although FIG. 5 illustrates anodic bonding of four wafer pairs, in other implementations, wafer bonder 20 may bond alternative numbers of wafer pairs.

FIG. 5 further illustrates various examples of independent wafer pairs having different wafer pairs with different silicon based wafers. In the example illustrated, wafer pair 215 comprises a silicon wafer 250 and an alkaline glass wafer 252 such as borosilicate glass wafer. Wafer pairs 212 and 214 comprise alkaline glass wafers 256, 257 and paired silicon wafers 258, 259, respectfully, having oxide layers 260. Wafer pair 216 has an alkaline glass wafer 266 and a paired SOI wafer 268 with a buried layer 270 of silicon dioxide.

As schematically shown by FIG. 5, heater 24 (shown in FIG. 1) applies heat 116 to heat stack 210 to an anodic bonding temperature. While stack 210 is at an elevated anodic bonding temperature (described above), electric field device 26 (shown in FIG. 1) creates oppositely directed electric fields through stack 210 by establishing a first electrical potential P1 at a location between a top and a bottom of stack 210 and at a location between junctions 221 and 224 of wafer pairs 214 and 215. Electric field device 26 further establishes a second electrical potential P2 between junctions 220 and 221 of wafer pairs 212 and 214 and between junctions 224 and 225 of wafer pairs 215 and 216. Although electrical potentials P1 and P2 are illustrated as being applied or located equidistant from the adjacent junctions, electrical potentials P1 and/or P2 may be located anywhere between the associated adjacent junctions. For example, electric potential P1 may be applied through an electrical contact that extends between wafers 252, 257, that contacts a side edge of either of wafers 252, 257 or that contacts a bottom face of wafer 257 or a top face of wafer 252.

The electrical potentials P2 are different than the electrical potential P1 to create the oppositely directed electric fields through stack 210. The electrical potentials P2 have a relationship to the electrical potential P1 such that $Na^+$ ions in the glass wafers 252, 256, 257 and 266 are driven or kicked away from the adjacent wafer pair junctions 224, 220, 221 and 225, respectively, to facilitate anodic bonding. In one implementation, electric potentials P1 are at ground while electrical potentials P2 are each at a positive voltage (+V). In another implementation, electrical potentials P2 are at ground while electrical potentials P1 or at a negative voltage (−V). In some implementations, electric potentials P2 may be different from one another and/or electrical potentials P1 may be different from one another.

As indicated by arrows 218, electric field device 26 (shown in FIG. 1) creates first electric fields in a first direction across junctions 220 and 224 of wafer pairs 212 and 215. As indicated by arrows 222, at the same time, electric field device 26 creates second electric fields in a second direction, opposite the first direction, across junctions 221 and 225 of wafer pairs 214, 216. An anodic bond forms at each of junctures 220, 221, 224, 225 to concurrently complete bonding of wafer pairs 212, 214, 215 and 216.

Figure 6:
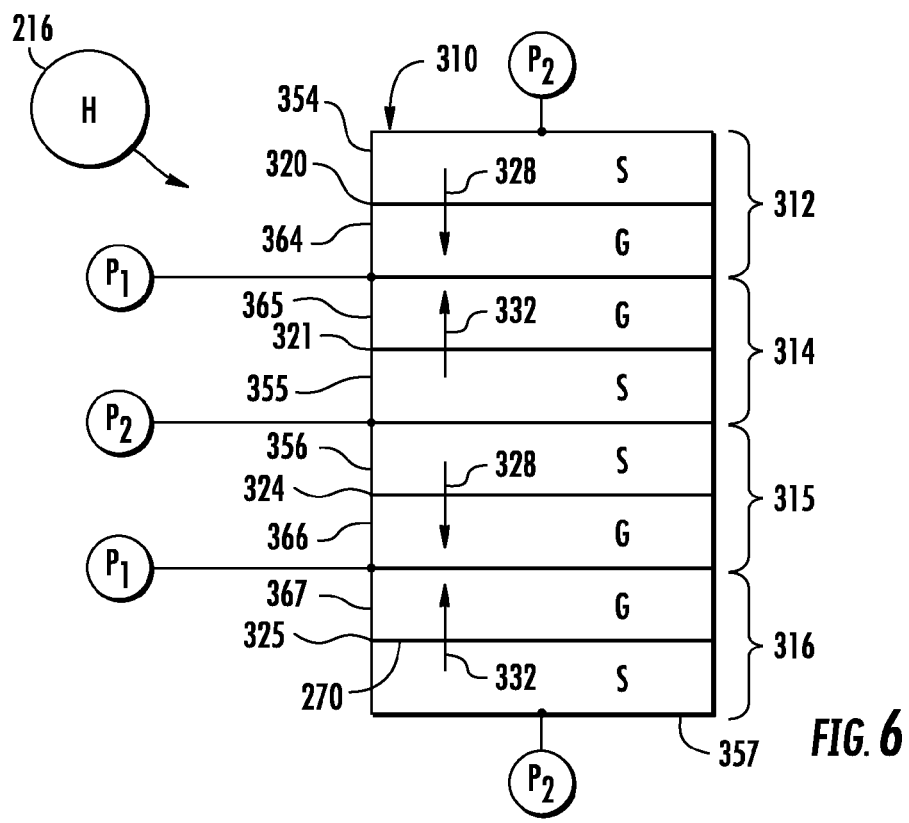
FIG. 6 is a schematic diagram illustrating another example of anodic bonding of a stack of independent wafer pairs by the bonder of FIG. 1 according to the method of FIG. 2.

FIG. 6 illustrates an example of anodic bonding of a stack 310 of independent wafer pairs 312, 314, 315 and 316. Wafer pairs 312, 314, 315 and 316 comprise silicon based wafers 354, 355, 356 and 357, and alkaline glass wafers 364, 365, 336 and 367, respectively. Each of the wafer pairs 312, 314, 315 and 316 of stack 310 are arranged in a back to back relationship.

As schematically shown by FIG. 6, heater 24 (shown in FIG. 1) applies heat 116 to heat stack 210 to an anodic bonding temperature. While stack 310 is at an elevated anodic bonding temperature (described above), electric field device 26 (shown in FIG. 1) creates oppositely directed electric fields through stack 310 by establishing a first electrical potential P2 at a location between a top and a bottom of stack 210 and at a location between junctions 321 and 324 of wafer pairs 314 and 315. Electric field device 26 further establishes a second electrical potential P1 between junctions 320 and 321 of wafer pairs 312 and 314 and between junctions 324 and 325 of wafer pairs 215 and 216. Although electrical potentials P1 and P2 are illustrated as being applied or located equidistant from the adjacent junctions, electrical potentials P1 and/or P2 may be located anywhere between the associated adjacent junctions. For example, electrical potential P2 may be applied through an electrical contact that extends between wafers 355, 356, that contacts a side of either of wafers 355, 356 or that contacts a bottom face of wafer 355 or a top face of wafer 356.

The electrical potentials P1 are different than the electrical potential P2 to create the oppositely directed electric fields through stack 310. The electrical potentials P1 have a relationship to the electrical potential P2 such that Na$^+$ ions in the glass wafers 364, 365, 366 and 367 are driven or kicked away from the adjacent wafer pair junctions 320, 321, 324 and 325, respectively, to facilitate anodic bonding. In one implementation, electric potentials P1 are at ground while electrical potentials P2 are each at a positive voltage (+V). In another implementation, electrical potentials P2 are at ground while electrical potentials P1 are at a negative voltage (−V). In some implementations, electric potentials P2 may be different from one another and/or electrical potentials P1 may be different from one another.

As indicated by arrows 328, electric field device 26 (shown in FIG. 1) creates first electric fields in a first direction across junctions 320 and 324 of wafer pairs 312 and 315. As indicated by arrows 322, at the same time, electric field device 26 creates second electric fields in a second direction, opposite the first direction, across junctions 321 and 325 of wafer pairs 314, 216. An anodic bond forms at each of junctures 320, 321, 324, 325 to concurrently complete bonding of wafer pairs 312, 314, 315 and 316.

Figure 7:
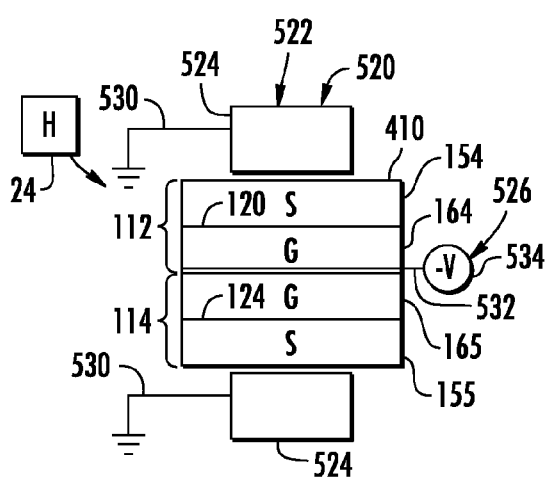
FIG. 7 is a schematic diagram illustrating another example implementation of the wafer bonder of FIG. 1.

FIG. 7 schematically illustrates concurrent anodic bonding of a wafer stack 410 by bonder 520, an example implementation of bonder 20 shown in FIG. 1. Stack 410 is similar to stack 110' discussed above, comprising wafer pairs 112, 114 arranged such that alkaline glass wafers 164, 165 extend proximate one another and are sandwiched between silicon based wafers 154 and 155.

Bonder 520 comprises wafer stack holder 522, heater 24 (described above) and electric field device 526. Waiver stack holder 522 comprises a pair of chucks 524 to hold or retain stack 410. In one implementation, the chucks 524 forming holder 522 are further configured to apply pressure or force to the top and bottom of stack 410. In one implementation, holder 522 supports stack 410 in a vacuum chamber. In the example illustrated, each of the chucks 524 are in electrically conductive contact with the top and bottom of stack 410 and are each electrically grounded to facilitate the forming of oppositely directed electrical fields through stack 410 by electric field device 526.

Electric field device 526 creates oppositely directed electric fields through stack 410. Device 526 comprises electrical grounding structures 530, conductive plate 532 and voltage source 534. Electrical grounding structures comprise structures connected to the top and bottom of stack 410 through chucks 524. Electrical grounding structures provide first electrical potentials for establishing an electric field through stack 410.

Conductive plate 532 comprises a plate of electrically conductive material sandwiched between wafers 164, 165 so as to electrically contact a majority of each of the opposing faces of wafers 164, 165. As a result, an electrical field is created across the majority of the faces of wafers 164, 165. In one implementation, conductive plate 532 is formed from graphite. As a result, conductive plate 532 absorbs heat induced stresses that may occur in wafers 164, 165 while minimally introducing impurities. In other implementations, conductive plate 532 may be formed from other electrically conductive materials.

Voltage source 534 comprises a voltage source to establish a second electrical potential with respect to the first electrical potential provided by grounding structures 530 such that oppositely directed electrical fields are formed across stack 410. The electric fields are directed such that Na$^+$ ions in the glass wafers 164, 165 are driven or kicked away from the adjacent wafer pair junctions 120, 124, respectively, to facilitate anodic bonding.

Figure 8:
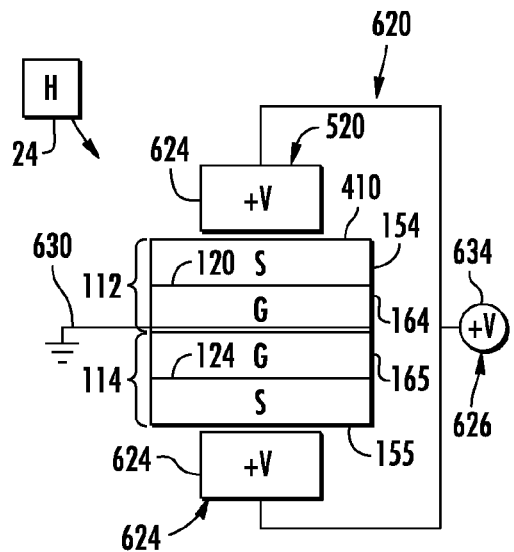
FIG. 8 is a schematic diagram illustrating another example implementation of the wafer bonder of FIG. 1.

FIG. 8 schematically illustrates an example of concurrent anodic bonding of a wafer stack 410 by bonder 620, an example implementation of bonder 20 shown in FIG. 1. Bonder 620 comprises wafer stack holder 622, heater 24 (described above) and electric field device 626. Wafer stack holder 622 comprises a pair of chucks 624 to hold or retain stack 410. In one implementation, the chucks 624 forming holder 622 or further configured to apply pressure or force to the top and bottom of stack 410. In one implementation, holder 622 supports stack 410 in a vacuum chamber. In the example illustrated, each of the chucks 624 are each in electrically conductive contact with the top and bottom of stack 410 and are each implemented as part of electric field device 626.

Electric field device 626 creates oppositely directed electric fields through stack 410. Device 626 comprises electrical grounding structure 630, conductive plate 532 (described above) and voltage source 634. Electrical grounding structure 630 comprises an electrically conductive and grounded structure connected conductive plate 532. Electrical grounding structure 630 provides a first electrical potential for establishing an electric field through stack 410.

Voltage source 634 comprises a voltage source to establish a second electrical potential with respect to the first electrical potential provided by grounding structure 630 such that oppositely directed electrical fields are formed across stack 410. In the example illustrated, voltage source 634 applies a positive voltage (+V) to the top and bottom of stack 410 through chucks 624. The electric fields are directed such that Na$^+$ ions in the glass wafers 164, 165 are driven or kicked away from the adjacent wafer pair junctions 120, 124, respectively, to facilitate anodic bonding.

Figure 9:
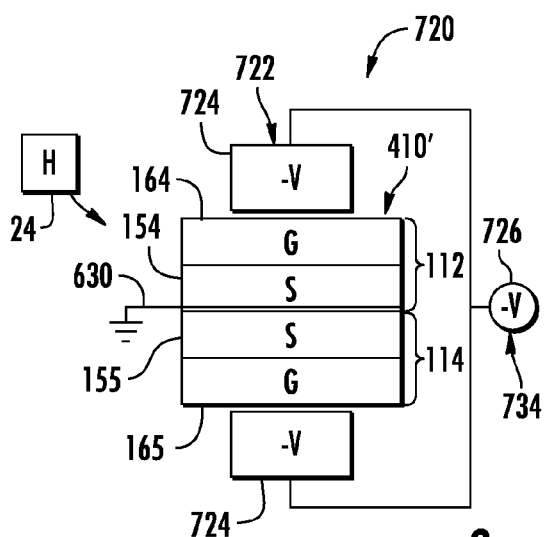
FIG. 9 is a schematic diagram illustrating another example implementation of the wafer bonder of FIG. 1.

FIG. 9 schematically illustrates an example of concurrent anodic bonding of a wafer stack 410' by bonder 720, an example implementation of bonder 20 shown in FIG. 1. Stack 410' is similar to stack 410 except that each of wafer pairs 112 and 114 are flipped such that the silicon based wafers 154, 155 of wafer pairs 112, 114 extend back to back or adjacent to one another. Components of stack 410' which correspond to components of stack 410 are numbered similarly.

Bonder 720 comprises wafer stack holder 722, heater 24 (described above) and electric field device 726. Wafer stack holder 722 comprises a pair of chucks 724 to hold or retain stack 410'. In one implementation, the chucks 724 forming holder 722 are further configured to apply pressure or force to the top and bottom of stack 410'. In one implementation, holder 722 supports stack 410' in a vacuum chamber. In the example illustrated, each of the chucks 724 are each in electrically conductive contact with the top and bottom of stack 410' and are each implemented as part of electric field device 726.

Electric field device 726 creates oppositely directed electric fields through stack 410'. Device 726 comprises electrical grounding structure 630, conductive plate 532 (described above) and voltage source 734. Electrical grounding structure 630 comprises an electrically conductive and grounded structure connected conductive plate 532. Electrical grounding structure 630 provides a first electrical potential for establishing an electric field through stack 410.

Voltage source 734 comprises a voltage source to establish a second potential with respect to the potential provided by grounding structure 730 such that oppositely directed electrical fields are formed across stack 410'. In the example illustrated, voltage source 734 applies a negative voltage (−V) to the top and bottom of stack 410' through chucks 724. The electric fields are directed such that $Na^+$ ions in the glass wafers 164, 165 are driven or kicked away from the adjacent wafer pair junctions 120, 124, respectively, to facilitate anodic bonding.

Figure 10:
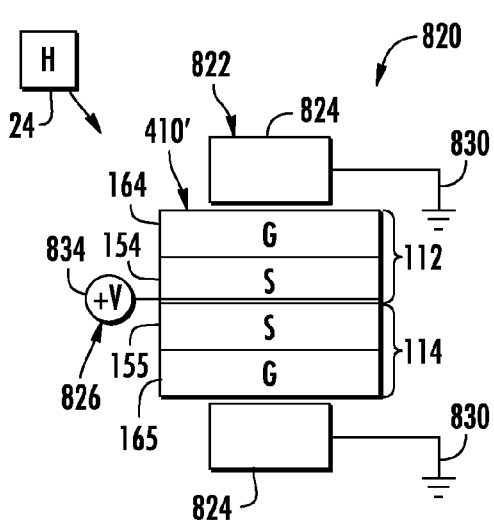
FIG. 10 is a schematic diagram illustrating another example implementation of the wafer bonder of FIG. 1.

FIG. 10 schematically illustrates concurrent anodic bonding of a wafer stack 410' by bonder 820, an example implementation of bonder 20 shown in FIG. 1. Bonder 820 comprises wafer stack holder 822, heater 24 (described above) and electric field device 826. Wafer stack holder 822 comprises a pair of chucks 824 to hold or retain stack 410'. In one implementation, the chucks 824 forming holder 822 are further configured to apply pressure or force to the top and bottom of stack 410'. In one implementation, holder 822 supports stack 410' in a vacuum chamber. In the example illustrated, each of the chucks 824 are each in electrically conductive contact with the top and bottom of stack 410' and are each electrically grounded to facilitate the forming of oppositely directed electrical fields through stack 410' by electric field device 826.

Electric field device 826 creates oppositely directed electric fields through stack 410'. Device 826 comprises electrical grounding structures 830, conductive plate 532 (described above) and voltage source 834. Electrical grounding structures comprise structures connected to the top and bottom of stack 410' through chucks 824. Electrical grounding structures 830 provide first electrical potentials for establishing an electric field through stack 410'.

Voltage source 834 comprise a voltage source providing a second electrical potential with respect to the electrical potential provided by grounding structures 830 such that oppositely directed electrical fields are formed across stack 410'. The electrical fields are directed such that $Na^+$ ions in the glass wafers 164, 165 are driven or kicked away from the adjacent wafer pair junctions 120, 124, respectively, to facilitate anodic bonding.

Figure 11:
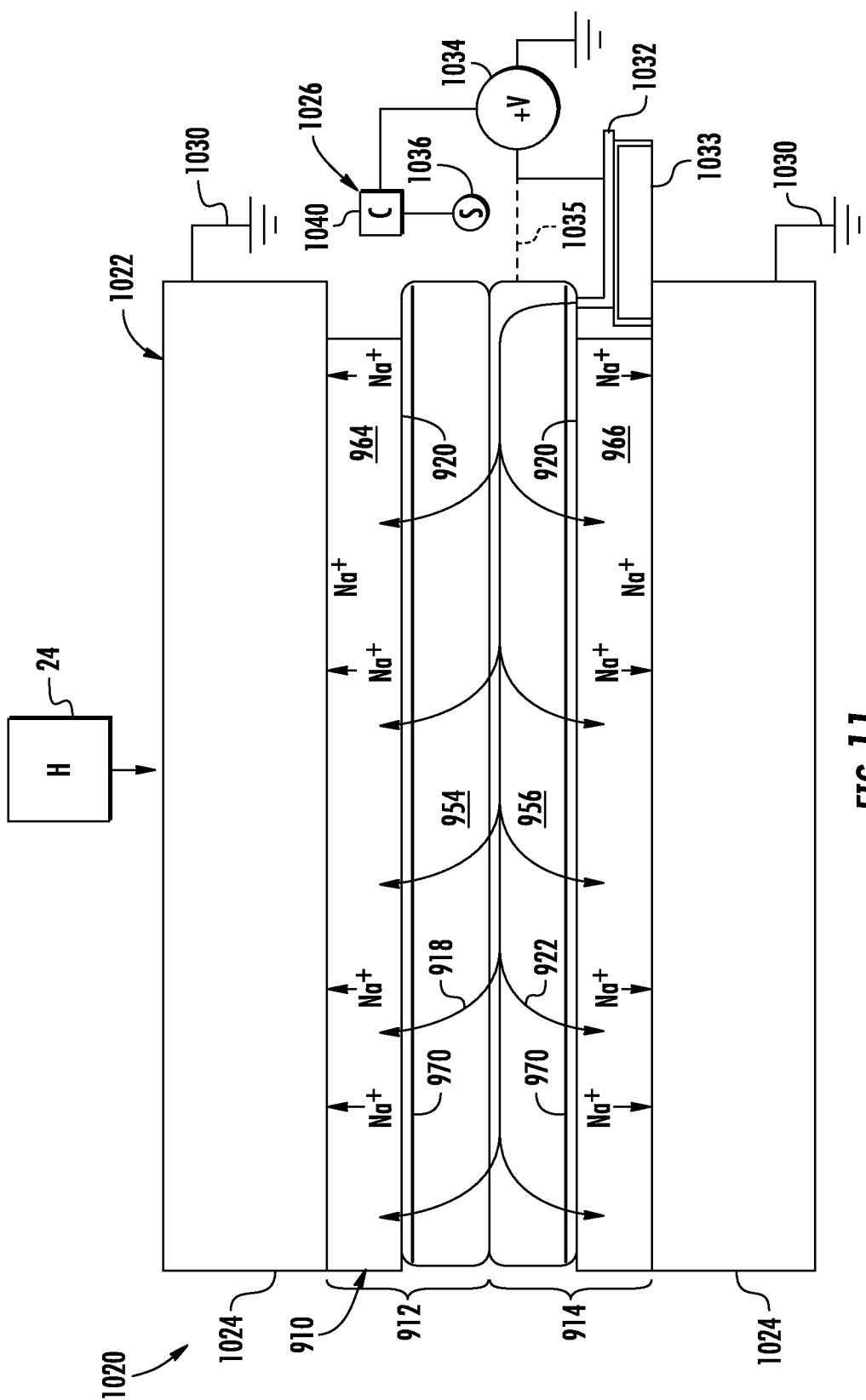
FIG. 11 is a schematic diagram illustrating another example implementation of the wafer bonder of FIG. 1 bonding a wafer stack.

FIG. 11 schematically illustrates concurrent anodic bonding of a stack 910 of independent wafer pairs 912, 914 by bonder 1020, an example implementation of bonder 20 shown in FIG. 1. Wafer pairs 912, 914 comprise silicon based wafers 954, 956 and alkaline glass wafers 964 and 966, respectively. Wafer pairs 912, 914 of stack 910 are arranged in a back to back relationship. In the example illustrated, silicon based wafers 954, 956 comprise SOI wafers, each of wafers 954, 956 including a buried oxide (box) layer 970.

Bonder 1020 comprises wafer stack holder 1022, heater 24 (described above) and electric field device 1026. Wafer stack holder 1022 comprises a pair of chucks 1024 to hold or retain stack 910. In one implementation, the chucks 1024 forming holder 1022 are further configured to apply pressure or force to the top and bottom of stack 910. In one implementation, holder 1022 supports stack 910 in a vacuum chamber. In the example illustrated, each of the chucks 1024 are in electrically conductive contact with the top and bottom of stack 910 and are each electrically grounded to facilitate the forming of oppositely directed electrical fields through stack 910 by electric field device 1026.

Electric field device 1026 creates oppositely directed electric fields through stack 910. Device 1026 comprises electrical grounding structures 1030, conductive contact 1032, voltage source 1034, sensor 1036 and controller 1040. Electrical grounding structures 1030 comprise structures connected to the top and bottom of stack 910 through chucks 1024. Electrical grounding structures 1030 provide first electrical potentials for establishing electric fields through stack 910.

Conductive contact 1032 comprises one or more electrically conductive structures by which electrical contact is made to stack 910 between junctions 920 and 924 of wafer pairs 912 and 914, respectively. Conductive contact 130 electrically connects voltage source 1034 to stack 910 to provide a second electrical potential with respect to the first electrical potential provided by grounding structures 1030 so to create oppositely directed electrical fields across stack 910. In the example illustrated, conductive contact 1032 provides an electrical conductive point in direct electrical contact with a lower face of wafer 956, wherein contact 1032 is insulated from wafer 966 and the bottom chuck 1024 by insulator 1033. As schematically indicated by broken line 1035, in another implementation, contact 1032 may alternatively contact a side edge of wafer 956. In such an implementation, the electric field generated or produced by device 1026 passes through a single box layer 970 in either direction rather than through both box layers 970 as when contact 1032 contacts a lower face of wafer 956. In such an implementation, the applied voltage may be lowered. In other implementations, conductive contact 1032 makes direct electrical contact with a side edge of either of wafer 954, a top face of wafer 954, a lower face of wafer 954 or an upper face of wafer 956. In yet another implementation, conductive contact 1032 may be replaced with conductive plate 532, described above with respect to FIG. 10, extending between and across opposite faces of wafers 954, 956.

Voltage source 1034 comprise a voltage source providing a second electrical potential with respect to the electrical potential provided by grounding structures 1030 such that oppositely directed electrical fields are formed across stack 910. As indicated by arrows 918 in FIG. 11, first electric fields extend across junction 920 in a first direction towards a top of stack 910. As indicated by arrows 922, second electric fields extend across junction 924 in a second direction, opposite the first direction, towards a bottom of stack 910. The electrical fields are directed such that Na+ ions in the glass wafers 964, 965 are driven or kicked away from the adjacent wafer pair junctions 920, 924, respectively, to facilitate anodic bonding.

Sensor 1036 and controller 1040 cooperate to adjust the voltage of voltage source 1034 during anodic bonding. Sensor 1036 comprises a device to sense electrical current passing through stack 910. Controller 1040 comprises at least one processing unit to adjust a voltage of voltage source 1034 based upon signals from sensor 1036 representing the sensed electrical current. In one implementation, controller 1040 may further control heater 24. For purposes of this application, the term "processing unit" shall mean a presently developed or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, controller 1040 may be embodied as part of one or more application-specific integrated circuits (ASICs). Unless otherwise specifically noted, the controller is not limited to any specific combination of hardware circuitry and software, nor to any particular source for the instructions executed by the processing unit.

During anodic bonding, portions of stack 910 gradually exhibit lowered conductivities. Controller 104 adjusts the voltage upwardly to address the reduced electrical conductivity and to maintain lower cycle times. In one implementation, controller 1040 adjusts the voltage of voltage source 1034 in a stepwise manner. In another implementation, controller 1040 adjusts the voltage of voltage source 1034 in a gradual or sloped manner.

Figure 12:
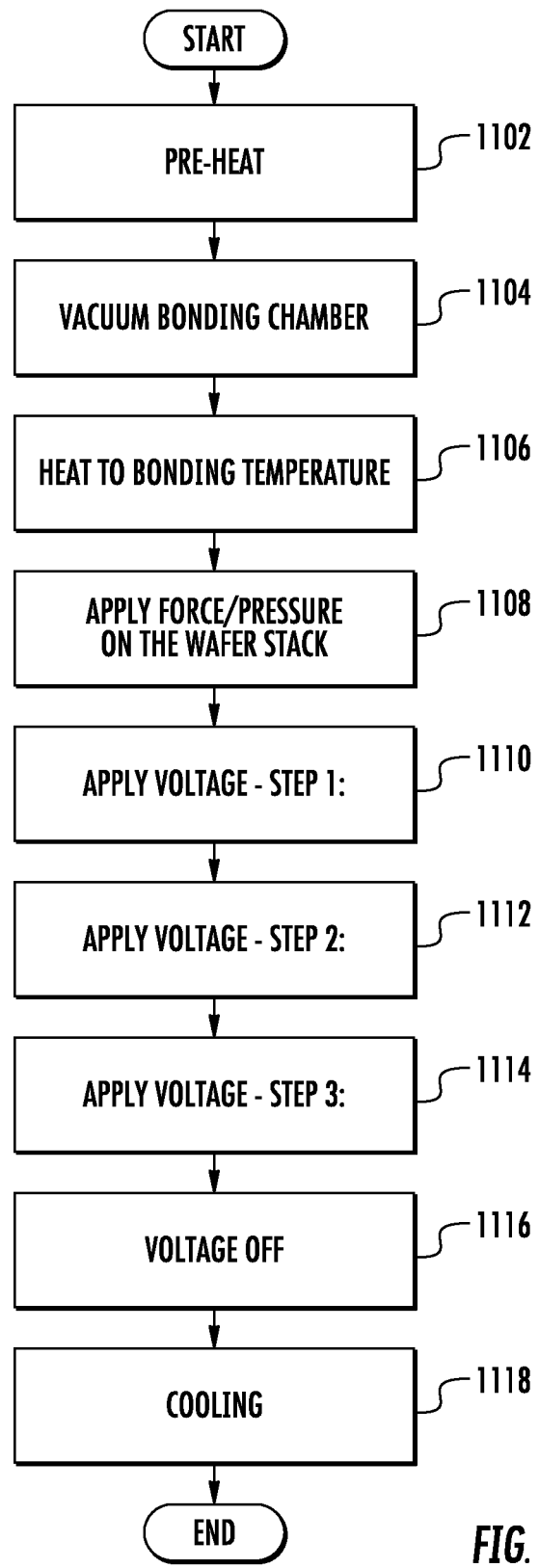
FIG. 12 is a flow diagram of an example anodic bonding method that may be carried out by the wafer bonder of FIG. 11.

FIG. 12 is a flow diagram illustrating one example method 1100 of anodic bonding of stack 910 that may be carried out by bonder 1020 of FIG. 11. As indicated by step 1102, controller 1040 generates control signals causing heater 24 to preheat stack 910 held by holder 1022. In one implementation, stack 910 is preheated to a temperature of at least 250° C.

As indicated by step 1104, the preheated stack 910 is placed within a vacuum bonding chamber. In one implementation, stack 910 may be preheated while within the vacuum bonding chamber. As indicated by step 1106, once within the vacuum bonding chamber, controller 1040 generate control signals directing heater 24 to heat stack 910 to an anodic bonding temperature. In the example illustrated where the anodic bond is between a silicon based wafers and a glass wafers, stack 910 is heated to an anodic bond temperature of at least 250° C. In one implementation, stack 910 is heated to an anodic bond temperature of 375° C. In other implementations, the anodic bond temperature may vary depending upon the composition the wafers as well as the voltage being applied by voltage source 1034. As indicated by step 1108, controller 1040 further generates control signals directing chucks 1024 of holder 10222 apply force or pressure to the wafer stack 910. In one implementation, in response to such control signals, holder 1022 applies a pressure of at least 50 KPa and nominally 64 KPa. In other implementations, step 1108 may be omitted.

Figure 13:
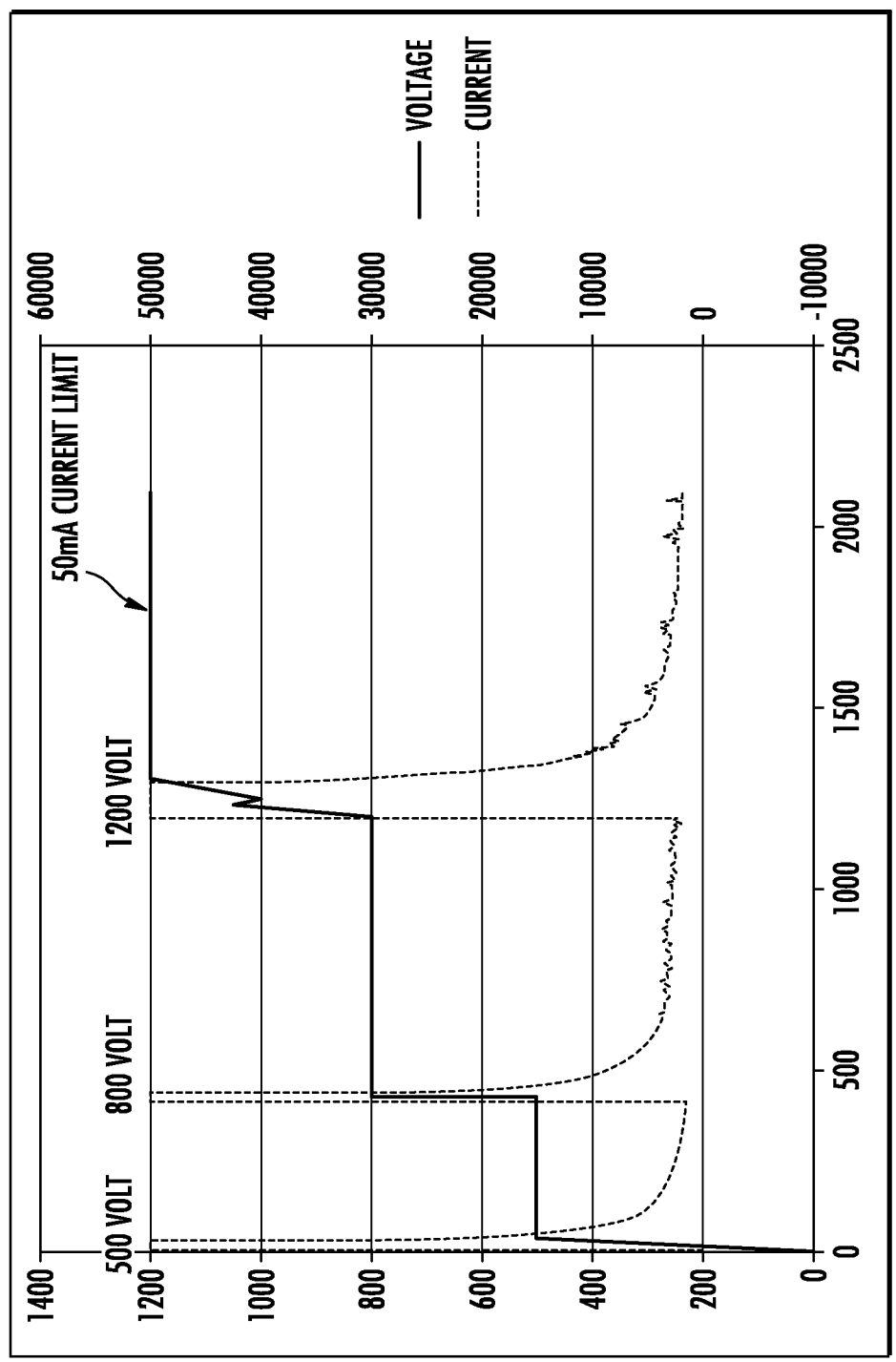
FIG. 13 is a graph illustrating an example current/voltage plot during anodic bonding of the wafer stack of FIG. 11 by the wafer bonder of FIG. 11.

As indicated by steps 1110, 1112 and 1114, based upon signals from sensor 1036 or in response to signals from sensor 1036 indicating a senses electrical current, controller 1040 generates control signals adjusting a voltage applied by voltage source 1034 to stack 910. In the example illustrated, controller 1040 applies three levels or steps of voltages based upon sensed current. FIG. 13 is a graph illustrating one example of steps 110-114 during anodic bonding of wafer pairs 912, 914 of stack 910 by bonder 1020. In the example shown in FIG. 13, controller 1040 generates control signals causing voltage source 1034 to apply a voltage of 500 V to stack 910 through contact 1032. In response to detecting a drop in current, controller 1040 generates control signals causing voltage source 1034 to apply a greater voltage of 800 V to stack 910 through contact 1032. Once again in response to detecting a drop in current, controller 1040 generates control signals causing voltage source 1034 to apply a greater voltage of 1200 V to stack 910 through contact 1032.

In another implementation, controller 1040 may adjust the voltage supplied by voltage source 1034 with greater or fewer than three steps or in a gradual or ramped manner. In other implementations, controller 1040 may include an internal timer, wherein controller 1040 generates control signals causing voltage source 1034 to apply different voltages for predetermined or predefined time periods. The predefined time periods may be based on prior experimental bonding results. For example, in one implementation, controller 1040 may initially apply a voltage of 500 V for 420 seconds, followed by 800 V for 780 seconds and finally a voltage of 1200 V for 900 seconds. In such an implementation, sensor 1036 may be omitted.

In the example shown in FIGS. 12 and 13, the voltage applied to stack 910 may vary depending upon the material properties of the wafer pairs 912, 914 of stack 910. In yet other implementations, steps 1110-1114 be replaced by a single step in which a single voltage is applied by voltage source 1034. In the example illustrated where wafers 954, 956 comprise SIO wafers, the applied voltage is at least 100 V, depending upon the thickness of the box layers 970. In one implementation, the voltage applied by flow source 1034 does not exceed 1600 V to increase bonding reliability. In the example illustrated in which contact 1032 contacts a bottom face of wafer 956, the field passes through two box layers 970, each layer having a thickness of 300 nm. In such an implementation, the top 1200 V applied by source 1034 reliably anodically bonds wafer pairs 912 and 914. In other implementations, the single top voltage or the top step voltage applied to stack 910 may vary depending upon the thicknesses, if any, of oxide layer(s) present on wafers 954, 956.

As indicated by step 116, after anodic bonding at junctions 920, 924, the voltage applied by both source 1034 is terminated. As indicated by step 118, the now bonded wafer pairs 912, 914 are allowed to cool and the process is ended.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
heating a stack of independent wafer pairs comprising a first wafer pair and a second wafer pair, wherein the first wafer pair and the second wafer pair are immediately consecutive in the stack and in a back to back arrangement; and
creating a first electric field in a first direction across a first junction of the first wafer pair; and
creating a second electric field in a second direction opposite the first direction across a second junction of the second wafer pair to concurrently anodically bond the first wafer pair at the first junction and the second wafer pair at the second junction without bonding the first wafer pair to the second wafer pair.

2. The method of claim 1, wherein each of the first wafer pair and the second wafer pair comprises a silicon based wafer and an alkaline glass wafer.

3. The method of claim 2, wherein the silicon based wafer is selected from a group of wafers consisting of: silicon, silicon on insulator and silicon having an oxide coating.

4. The method of claim 2, wherein silicon based wafers of the first wafer pair and the second wafer pair are sandwiched between alkaline glass wafers of the first wafer pair and the second wafer pair.

5. The method of claim 1 comprising applying a voltage to an electrically conductive plate extending between the first wafer pair and the second wafer pair.

6. A method comprising:
electrically grounding a first chuck and a second chuck;
positioning independent wafer pairs between the first chuck and the second chuck with immediately consecutive wafer pairs in a back-to-back arrangement;
heating the independent wafer pairs;
applying a voltage to a wafer of one of the independent wafer pairs.

7. The method of claim 6, wherein each of the independent wafer pairs comprises a first wafer of a first material and a second wafer of a second material different than the first material and wherein the first material of the first wafer of one of the immediately consecutive independent wafer pairs is adjacent the first material of the first wafer of the other of the immediately consecutive independent wafer pairs.

8. The method of claim 6, wherein the immediately consecutive wafer pairs comprise:
a first wafer pair having a first silicon based wafer and a first alkaline glass wafer; and
a second wafer pair having a second silicon based wafer and a second alkaline glass wafer, wherein first silicon based wafer and the second silicon based wafer are sandwiched between the first alkaline glass wafer and the second alkaline glass wafer.

9. The method of claim 6, wherein the immediately consecutive wafer pairs comprise:
a first wafer pair having a first silicon based wafer and a first alkaline glass wafer; and
a second wafer pair having a second silicon based wafer and a second alkaline glass wafer, wherein first alkaline glass wafer and the second alkaline glass wafer are sandwiched between the first silicon based wafer and the second silicon-based wafer.

10. The method of claim 6, wherein only one side of each wafer of each wafer pair is a anodically bonded to another wafer.

11. The method of claim 1, wherein only one side of each wafer of each of the independent wafer pairs of the stack is anodically bonded to another wafer.

* * * * *